US006289130B1

(12) United States Patent
Cooklev

(10) Patent No.: US 6,289,130 B1
(45) Date of Patent: Sep. 11, 2001

(54) METHOD FOR REAL-TIME LOSSLESS DATA COMPRESSION OF COMPUTER DATA

(75) Inventor: Todor Cooklev, Salt Lake City, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/243,206

(22) Filed: Feb. 2, 1999

(51) Int. Cl.[7] .................. H04N 1/00; G06K 9/36
(52) U.S. Cl. ........................... 382/232; 358/426
(58) Field of Search .................. 382/232, 233, 382/166; 358/426, 261.1, 432; 341/65

(56) References Cited

U.S. PATENT DOCUMENTS

| | | | |
|---|---|---|---|
| 4,558,302 | 12/1985 | Welch | 340/347 |
| 5,260,693 | 11/1993 | Horsley | 341/67 |
| 5,384,780 | 1/1995 | Lomp et al. | 370/94.1 |
| 5,455,576 | * 10/1995 | Clark, II | 341/50 |
| 5,483,556 | 1/1996 | Pillan et al. | 375/340 |
| 5,627,533 | 5/1997 | Clark | 341/51 |
| 5,663,721 | 9/1997 | Rossi | 341/51 |
| 5,926,226 | * 7/1999 | Proctor | 348/422 |

OTHER PUBLICATIONS

C. Thomborson, "The V.42bis Standard to Data–Compressing Modems," IEEE Micro Oct. 1992, pp. 41–53.

Internation Telecommunication Union, The Internation Telegraph and Telephone Consultative Committee, Data Compression Procedures for Data Circuit Terminating Equipment (DCE) using Error Correction Procedures, Recommendation V.42bis. Geneva, 1990.

* cited by examiner

*Primary Examiner*—Jerome Grant, II
(74) *Attorney, Agent, or Firm*—Workman, Nydegger & Seeley

(57) ABSTRACT

A data compression scheme as described which improves upon and is compatible with the V.42bis data compression standard of the International Telecommunications Union (ITU). The data compression scheme provides an efficient algorithm to determine when as well as how to efficiently switch between transparent and compressed modes to provide and facilitate an improved compression ratio. Additionally, a temporary buffer is provided for use by the encoder in determining which of either transparent or compressed mode provides a more efficient transfer of a portion of data. In making a determination to transition between transmit modes, the incurred overhead associated with such transitions is also taken into account. An approach for evaluating when to discard a particular dictionary that has become inefficient is also provided thereby enabling an improvement in the transmission of multimedia data and the regeneration of a dictionary more representative of the presently evaluated data type.

21 Claims, 2 Drawing Sheets

METHOD FOR REAL-TIME LOSSLESS DATA COMPRESSION OF COMPUTER DATA

BACKGROUND OF THE INVENTION

1. The Field of the Invention

The present invention relates generally to digital data compression techniques. More specifically, the present invention relates to a method and computer executable instructions for compressing computer data using lossless data compression techniques. Even more specifically, the present invention relates to an efficient compression algorithm capable of efficiently switching between compression and non-compression modes.

2. The Relevant Technology

Data compression is a technique wherein a signal, or computer data which requires a certain number of bits for representation, is represented, or encoded using a fewer number of bits. The ratio between the number of bits required by the original signal to the number of bits required by the encoded signal is known as the compression ratio. The complimentary process in which the signal, or computer data is expanded and reconstructed in its original form is called decompression, decoding or reconstruction.

Data compression is a technology which has matured during the most recent decade. Upon initial blush, it may be thought that with the advances in technology and the availability of computer resources such as memory and execution bandwidth, that such an abundance of resources would render data compression unnecessary. In fact, the contrary is the more precise case. That is to say, while we presently have more computer resources available such as memory and bandwidth, the conservation and efficient use of such resources is of preeminent concern due to the explosive appetite for and availability of transferrable information. Therefore, there continues to be an insatiable ongoing appetite for efficient transfer and storage of data information.

Those familiar with the art of data compression appreciate that there are two major types of compression: lossy and lossless. In a lossy compression system, portions of the data that are determined to be less necessary are discarded making exact reconstruction or decompression of the signal impossible. Lossy compression is employed for physical signals such as speech, audio, images and video in which exact reconstruction of the original signal is usually not required for perceptive acceptability. Since such signals as those immediately described above are generally destined for human perception, such as by the human auditory or visual systems, minor differences between the original and reconstructed signals may either be undetected by human systems or tolerable in their degraded state.

In contrast, lossless compression enables an exact reconstruction of the original signal to be performed upon decompression. That is to say, lossless compression achieves a perfect recreation of the original signal without the degraded or compromised characteristics of lossy compression techniques. One of the penalties of employing lossless compression which yields perfect reconstruction is that the compression ratio or the ability to compress a larger number of data bits into a smaller number of data bits is greatly reduced. For certain types of data information, it is imperative that perfect reconstruction of lossless data compression be employed rather than the compromised reconstruction approach characteristic of lossy compression techniques. For example, computer data must be precisely reconstructed otherwise disastrous effects will occur. Therefore, lossless compression techniques must be employed for the compression of computer data used in computer communications.

With the voluminous amount of data exchanged over computer networks, it is apparent that data compression is a useful feature in computer communications. For example, in the transmission of highly compressible data, V.42bis might lead up to a nearly four fold improvement in speed. Such a compression factor yields sizable cost savings when the transmission is over a toll line such as a long distance telephone connection or over a wireless telephone connection such as a cellular telephone connection. The cost and time savings as well as the benefit of having a faster connection are not negligible even over a local or non-toll telephone connection. Such improvements are highly desirable resulting in a constant demand for better and improved lossless data compression algorithms.

Several approaches have been purposed and promulgated for lossless data compression. One such approach, commonly known as the "sliding window" approach, is an earlier modem dictionary-based compression scheme. In such an approach, a block of the most recently received data is stored. The window is continuously updated by dropping the oldest character in the window as a new character is being received. Upon receiving a new character, the current window is searched for a matching string. When a matching string is located in the window, a pointer to the string in the window is sent to the decoder. An advantage of this compression technique is that the decoder does not need to perform string matching. The disadvantage of such an approach is that string comparisons against the look-ahead buffer must be performed for every position in the text window. Some improvements to the sliding window algorithm are also known, but all of these algorithms are biased towards exploiting the most recently encountered text. A second major problem with such an approach is the limited size of a phase that can be matched, due to the limited size of the look-ahead buffer. It is known in the art that increasing the size of the sliding window and the look-ahead buffer does not alone solve such problems because such an approach leads to huge computational complexity problems and the algorithm cannot be performed in real-time.

The International Telecommunications Union (ITU), previously known as CCITT, promulgated an improved encoding scheme known as the V.42bis standard for computer communications over a telephone network. The V.42bis standard is a textual substitution scheme based on Ziv-Lempel's second algorithm describing that wherever a code word is transmitted, the dictionary is augmented by a new code word consisting of the code word being transmitted concatenated with the next character in the input stream. Initially, such a dictionary consists of all one-character strings. It is apparent that strings of characters with repeated substrings are efficiently coded by such an approach. For example, English text is moderately repetitive and employing the V.42bis achieves a compression ratio of about 2.3 on English text.

Originally, Ziv and Lempel suggested an algorithm that outputs a code word for the longest string match and the character that broke the match. The inventor, T. Welch, and U.S. Pat. No. 4,558,302, made some important improvements to the original window approach. In particular, the encoder in that implementation outputs only code words which required that the dictionary be initialized with all possible one-character strings. Such an improvement is very suitable for real-time applications such as data communications involving a modulator-demodulator (modem).

Yet another data compression scheme which has been proposed for computer communications over a telephone network is known as the Microcom Networking Protocol (MNP-7). Such a protocol associates pairs of characters with a code word and in one implementation assumes 8-bit characters yielding a total number of possible characters of 256, however, the total number of all possible combinations of two characters results in an infeasible size for storage within an embedded system such as a modem. Actual implementations using such a protocol typically result in the storage of the most common pairs in memory of approximately 1024 bytes in size.

The present implementation of V.42bis incorporates additional functionality as proposed in Miller and Wegman's idea of gradually increasing the size of the dictionary. In such an implementation, upon initialization or reinitialization there exists 512 code words in the dictionary with a code word size of nine bits. Such an implementation also proposed two modes of operations: compressed mode and transparent mode. Compression and dictionary updating is performed in both modes, however, in transparent mode, characters are sent as they are received. In both modes, there are commands which can be transmitted to the decoder. In transparent mode, a two-character sequence, beginning with the special character escape, followed by the command ECM (e.g., enter compression mode) produces a signal to the decoder to shift or transform into compressed mode. In compressed mode, there are three separate control code words. The control code word, ETM (e.g., Enter Transparent Mode) produces a signal to the decoder to switch to transparent mode.

As described above, the compression ratio achieved by an algorithm in compressed mode depends upon the compressibility of the data. The same reality exists for the compression algorithms in the V.42bis standard. For highly compressible data, the compression ratio can approach approximately 4. However, if the data in question is not compressible, the algorithm employed by V.42bis in compressed mode not only does not provide compression, but can lead to data expansion. Such a situation would arise if, for example, the input data to the compression process is data that has already undergone a compression process. If highly incompressible data is encountered, it is advantageous to transmit such highly incompressible data (e.g., previously compressed data) in transparent (i.e., not additionally compressed) mode. It should be apparent that transparent mode does not provide any data compression and therefore will not result in any data expansion.

While the V.42bis standard provides several requirements for the implementation of the standard, many aspects of the standard are under-specified. For example, the V.42bis standard does not specify when and how the encoder may decide to switch from transparent mode to compressed mode and vise versa. The standard also does not address when and how an encoder decides upon discarding an entire dictionary. As a result of such ambiguities and under-specification, different implementations or flavors of V.42bis vary in performance between implementing manufactures causing varying levels of compression efficiency. That is to say, one manufacture's implementation of the V.42bis standard is not necessarily as efficient as another manufacture's implementation of the standard.

The use of data communications has become much more popular since the adoption of the V.42bis compression standard incorporation into modem modems. Additionally, since the advent of the Internet, the use of modems for data communications has exploded. For users employing their modem in accessing the Internet, they must employ or run a point-to-point (PPP) or a serial-line interface protocol, or SLIP stack on the computer hosting the modem. Those familiar with Internet usage and the associated protocol appreciate the multimedia and hence multi-data type of computer data transferred between the Internet and the user's modem. The effect of such use of these protocols is that several types of data are multiplexed. Thus, consecutive packets can have a very different compression characteristic or capability. Such conditions result in a reduced compression performance for V.42bis modems. Therefore, there is a need to improve the compression performance when several types of data are multiplexed over one modem line.

One suggested approach, has been to develop a compression algorithm different from the widely accepted V.42bis modem standard. While such an approach may prove meritorious in that a standard may be developed specifically for handling such conditions, the fact remains that the large majority of modem installations presently employ the V.42bis standard and the development of an incompatible standard would result in the inability for a large modem installation base becoming obsolete or unable to communicate with newer-protocol modems. Therefore, there is a need to retain compatibility with V.42bis protocol standards while attempting to improve the compressibility of multidata type data streams exchanged between modems.

OBJECTS AND SUMMARY OF THE INVENTION

It is, therefore, an object of the present invention to provide a means for determining an efficacious transition between data transfer in transparent or compressed modes.

It is another object of the present invention to provide a means for augmenting the encoder of a data compression standard to buffer a portion of data to evaluate when an efficacious transition between transparent and compressed modes should be undertaken.

It is still another object of the present invention to provide a means for determining when an entire dictionary in a dictionary compression algorithm would advantageously be discarded.

It is yet another object of the present invention to provide an environment wherein the above objects may be incorporated into an established and accepted compression protocol such as the V.42bis standard.

It is an even further object of the present invention to provide methods and computer readable media for achieving the foregoing.

In accordance with the invention as embodied and broadly described herein, the foregoing and other objectives are achieved by providing methods and computer readable media for evaluating a portion of computer data and determining when transfer of such data would be performed more advantageously in either a compressed mode or in a transparent mode. Such an evaluation includes within its calculation the overhead associated with transitioning between transparent and compressed modes.

While the V.42bis standard has been defined for alternating between transparent and compressed modes, an efficient technique for determining an efficacious condition wherein a mode transition should be invoked has heretofore been non-analytic in making such a determination. The present invention integrates into a data compression scheme, the preferred embodiment of which is the V.42bis standard, used for transmitting data in either a compressed or a transparent mode. The present invention determines a preferred mode for transmitting the data by performing an evaluation on a portion of the data prior to dispatching or transmitting the said portion of data.

In the preferred embodiment of the present invention, a plurality, namely a transparent look-ahead buffer and a compression look-ahead buffer, are employed for storing the portion of data undergoing evaluation. In the present invention, one copy of the portion of data is stored in the transparent look-ahead buffer without undergoing any processing. Similarly, another copy of the portion of data undergoing evaluation is subjected to the compression algorithm, namely the encoding of the data characters with code words from an encoding dictionary, and the encoded portion of data is thereafter stored or buffered in the compression look-ahead buffer. Each of the characters of the portion of data are sequentially evaluated and stored in the respective buffers.

When one of the buffers reaches capacity, a buffer fullness ratio is calculated which compares the relative fullness of each of the look-ahead buffers. In essence, an efficiency of encoding may be determined by the amount of capacity remaining in the compression look-ahead buffer when the transparent look-ahead buffer reaches capacity. That is to say, if the dictionary utilized for encoding the portion of data is efficiently performing, then a reduced number of bits in the form of code words results in remaining capacity in the compression look-ahead buffer when the transparent look-ahead buffer reaches capacity.

It should be noted, that it is possible for the compression look-ahead buffer to reach capacity prior to the transparent look-ahead buffer when a situation of data expansion arises due to an inefficient encoding dictionary. Additionally, even though a transparent buffer may reach capacity prior to the compression look-ahead buffer, the compression efficiency may not be sufficient to warrant a transition from transmitting the data in a transparent mode to a compressed mode when the additional overhead associated with the mode transition is taken into account. Therefore, a preferred mode threshold is also calculated for comparison against the relative fullness ratio of the respective buffers. In the present invention, unlike other prior approaches, the overhead associated with the mode transitions is taken into account when calculating an efficacious transition between transmission modes.

Therefore, the present invention describes a data compression scheme which improves upon and is fully compatible with existing data compression schemes, namely the V.42bis data compression standard. Since all of the improvements of the present invention relate to determining a preferred transmit mode, the present invention does not effect or encumber the installation base of other V.42bis compatible transceiving devices. Indeed, the present invention provides first, an efficient algorithm to determine when and how to switch between transparent and compressed modes. Secondly, the present invention introduces temporary buffers into the encoder for buffering the portion of data undergoing analysis prior to transmission. Thirdly, the present invention also provides an algorithm for determining when a particular dictionary has outlived its effectiveness and should be discarded.

These and other objects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

Figure 1:
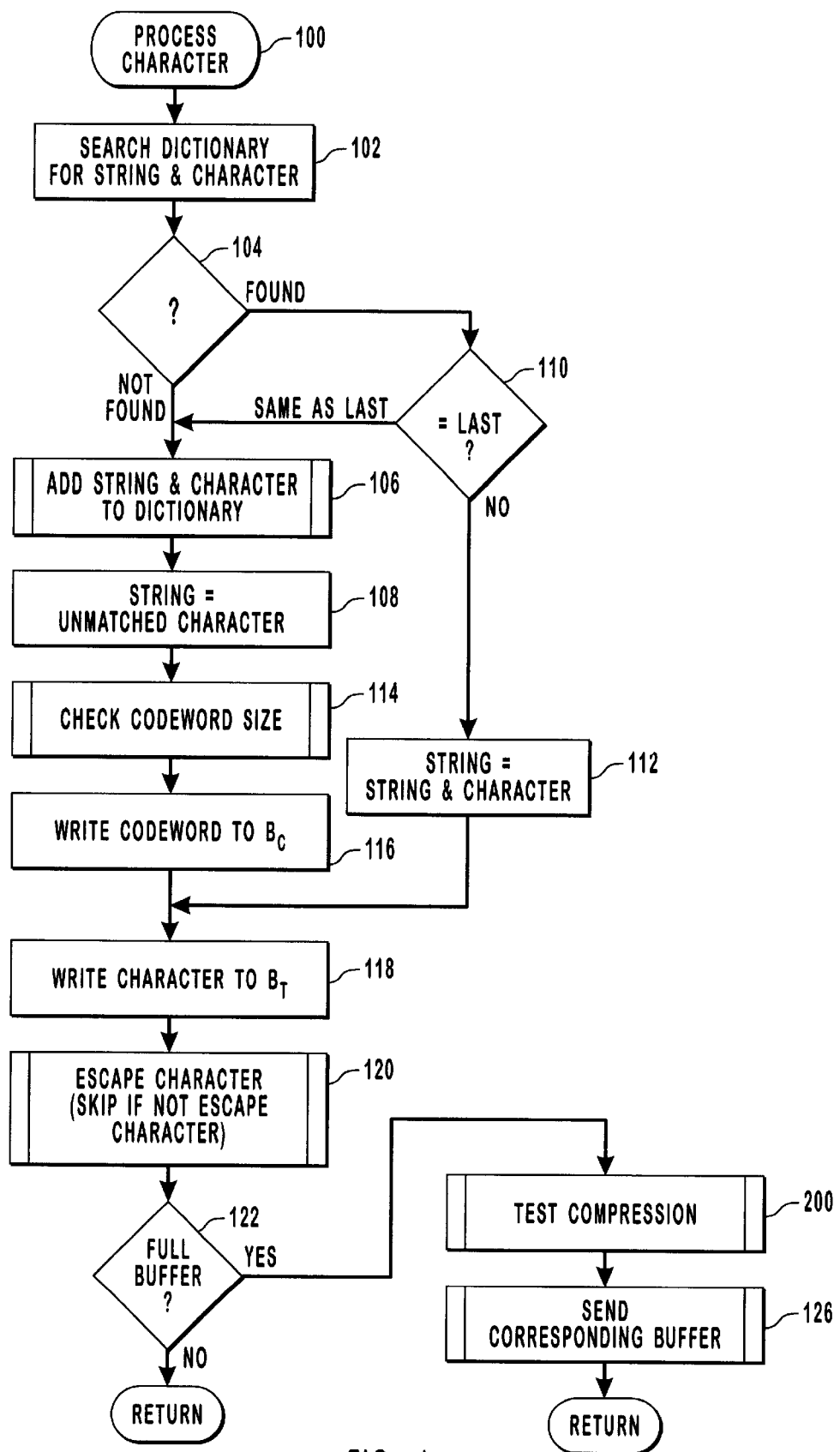
FIG. 1 is a flow diagram describing the modification of a traditional V.42bis processing flow chart to incorporate a more efficient transfer mode of operation, in accordance with the preferred embodiment of the present invention.

The present invention relates to a data compression scheme that is compatible for use with V.42bis data compression standards promulgated by the International Telecommunications Union (ITU). The present data compression invention provides at least three distinct numerable innovations. First, an efficient algorithm is provided which evaluates a portion of data and determines both when and how to switch between transparent and compressed modes. Secondly, a temporary buffer is introduced for incorporation into the encoder of the compression process for evaluating the data to be transferred and making a determination therefrom of whether to transmit the data in transparent or compressed mode. Thirdly, the present invention describes a method for determining when an entire data compression dictionary should be discarded. The data compression invention facilitates a higher compression ratio than has heretofore been implemented in the V.42bis standard while requiring only a minor increase in the computational complexity.

As used herein, the term "transparent mode" is a mode of operation in which compression has been selected but data is being transmitted in uncompressed form. The use of transparent mode may require insertion of transparent mode command code sequences into the data stream.

As used herein, the term "compressed mode" is a mode of operation in which data is transmitted in codewords.

As used herein, the term "escape character" is a character which, in transparent mode, indicates the beginning of a command code sequence.

As used herein, the term "codeword" is a binary number between 0 and $N_2-1$ which represents a string of characters in compressed form.

Those of skill in the art appreciate that particular transmission standards are established for use in data transmitting devices such as modems. As used herein, the term "V.42bis" describes a particular data communication standard for data communication over a telephone network. One particular facet as defined in the data communication standard is the data compression procedure for operating in both compressed and transparent modes.

It should be pointed out that the need to have an efficient algorithm for transition between transparent and compressed modes arises from at least two necessities. For example, upon initialization, the encoder which performs the actual encoding of the data initially operates in transparent mode. If the encoder does not have an efficient mechanism to switch from transparent to compressed mode, the encoder might never leave transparent mode and might not provide any compression of the communication data whatsoever. On the other hand, compressed mode is not always the best mode for operation since it may result in data expansion. If data presented to the encoder is of such a form that is unsatisfactory for transmission in compressed mode, then the encoder should switch to transferring the data in transparent mode.

It should be appreciated that the transition between modes requires the exchange of overhead data, and therefore incurs a bandwidth cost which must be factored into a determination of whether or not to undertake a mode transition. In the present invention, the cost of switching modes is defined as overhead, (i.e., the number of additional bits necessary to transmit). For example, suppose the cost for transition from transparent mode to compressed mode is $C_{TC}$ and the cost for transition from compressed to transparent mode is $C_{CT}$. In the exemplary embodiment that employs the V.42bis standard, which is herein incorporated by reference, it is known that $$C_{TC} = 16 \text{ bits}, \quad (1)$$

Since to make a transition from transparent to compressed modes, the encoder must send an escape character or sequence using eight bits, and the enter compressed mode (ECM) command code using yet an additional eight bits.

While the above analysis is predictable for the transition from transparent to compressed mode, it is more difficult to analyze the cost for transition from compressed to transparent modes under the exemplary standard. For such an analysis we may assume that if the current matched string or series of characters is empty, then the cost $C_{CT}$ would be $$C_{CT} = CW + Z \text{ bits} \quad (2)$$

where CW is the current codeword size in bits and Z is the number of zeros necessary for transmission to recover the byte alignment. In such an analysis we may consider the current codeword size to be a discrete random variable that may take values between 9 and 11. It should be pointed out that the maximum codeword size is not specified in the V.42bis standard, but most implementations by modem manufactures employ a 2K dictionary, which implies eleven bit codewords. However, when a decision is made as to whether to switch from compressed mode to transparent mode, the value of CW is known exactly. Z is a discrete random variable and can take values between 0 and 7. Z may be considered to be uniformly distributed with mathematical expectation $$E(Z) = \frac{7}{2}. \quad (3)$$

If the current matching string is not empty, then $$C_{CT} = 2*CW + Z \text{ bits if current CW stays the same}$$

$$CW + 2*(CW+1) + Z \text{ bits if the current CW is increased} \quad (4)$$

In addition to the cost for transition from compressed to transparent modes as described in Equation 2, the encoder must transmit the code word for the current matched string using CW bits if there is no need to increase the current word size. However, if there is a need to increase the current code word size, a STEPUP control code word using CW bits, which informs the decoder that the code word size is to be increased and then will transmit the code word for the current matched string and the ETM (enter transparent mode) control code word each using CW+1 bits, since the code word size has been increased.

FIG. 1 depicts a flowchart describing the processing flow which is performed in a lossless data compression process, in accordance with a preferred embodiment of the present invention. It should be appreciated that process character process 100 is the process which is undertaken by the encoder for evaluating a received character on the transmitting side of a communication device such as a modem. In process character process 100, a character is evaluated to determine if it is capable of being transmitted by the encoder into a compressed data stream as encoded into a code word from a dictionary by the encoder. In task 102, the present string which may be a single character in conjunction with a subsequent character is compared in a query task 104 to determine if the string concatenated with the character is found in the dictionary. If the string is not found in the dictionary then a task 106 adds the string plus the character to the dictionary thereby forming an additional entry in the dictionary that corresponds to a code word representing the string plus the character. In a task 108 the string is then given the value of the unmatched character for a subsequent process.

If in the query task 104 an entry for the string and the concatenated character is found in the dictionary, then query task 104 passes to a query task 110 for determining if the string plus the character match is the same as in the last comparison task. If so, processing passes back to task 106. When the present string plus the character is not the same as the past comparison then the processing passes to a task 112 wherein the value of the string is equal to the string plus the character value.

A task 114 performs the operation of comparing the code word size to determine if the number of bits representing the codeword exceeds the capacity for representation by the number of bits employed for the codeword. If such a process occurs, a STEPUP control process must be performed as described in the V.42bis standard incorporated above by reference. In a task 116, the codeword is written to the buffer $B_c$ which is the compression buffer now having the codeword therein. In a task 118, the character is written to the buffer $B_T$ which is the buffer for transparent mode operations.

Any characters that are escape characters are serviced in task 120. If no escape character is present, then task 120 is skipped. In a query task 122, the comparison is performed to determine if a buffer is full. When a buffer is determined to not be full, then processing terminates. However, when a buffer is determined to be full as a result of query task 122, a test compression process 200 is performed to determine whether the present mode status, either transparent or compression, should be changed or, alternatively, the entire dictionary purged. Test compression process 200 is detailed in FIG. 2. Upon the successful evaluation and transformation if necessary of the transmitting mode, the corresponding buffer for the present preferred mode is sent in a task 126 after which the process terminates.

Figure 2:
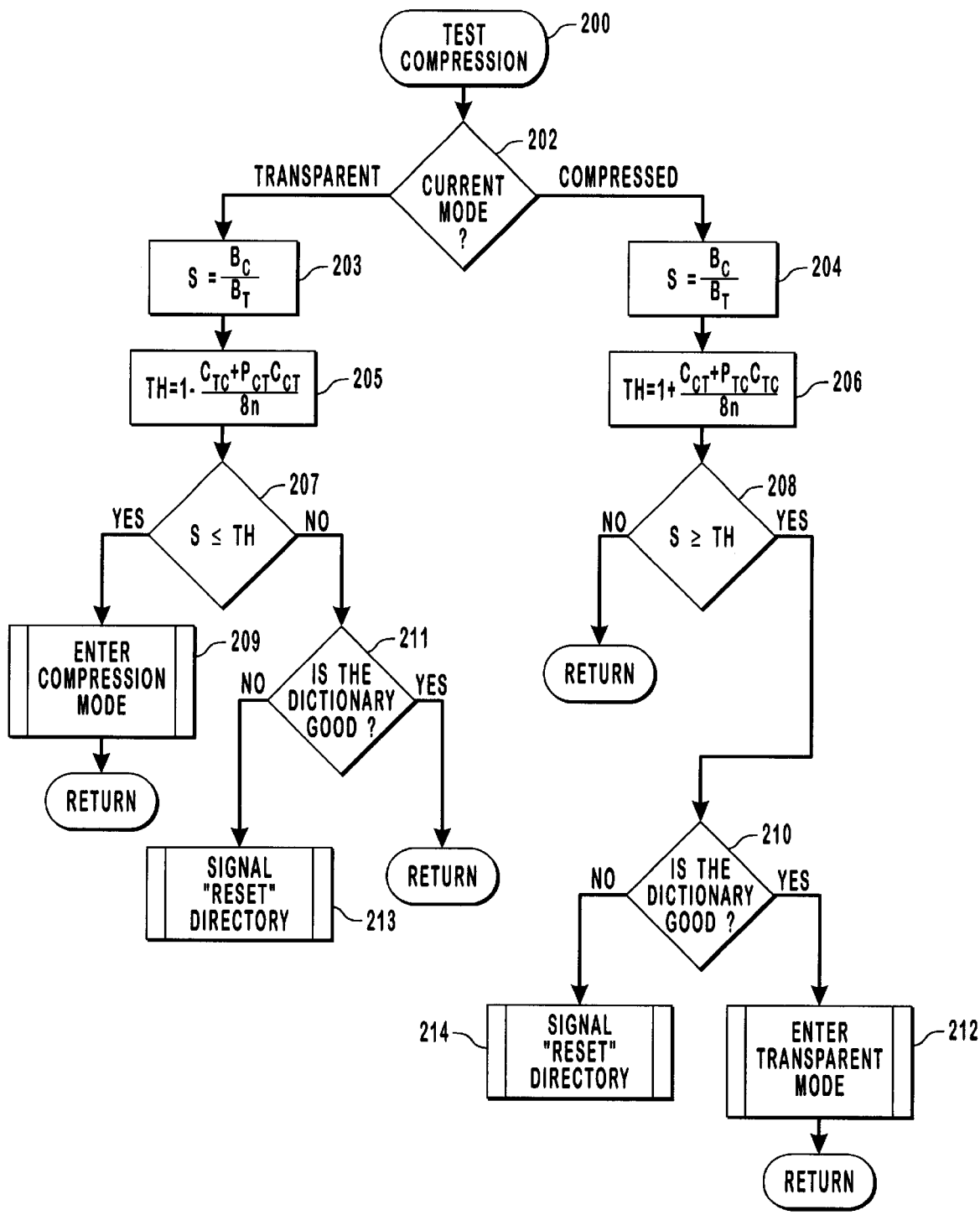
FIG. 2 is a flow diagram for evaluating the present portion of communication data and determining if a mode transition is efficacious, in accordance with a preferred embodiment of the present invention.

FIG. 2 is a flow diagram of the test compression process for determining if a transition between a particular transmission mode should be undertaken, in accordance with a preferred embodiment of the present invention to make a decision when to switch modes of operation, the present invention introduces two look-ahead buffers, $B_C$ and $B_T$, for each mode of operation. Regardless of which mode the encoder is presently operating in, the output of both modes of operation is written to the corresponding look-ahead buffer. When one of the buffers becomes full, a decision is made about which of the buffers is most suitable for transmitting, (i.e., should a transition between modes be implemented or is it most efficient to remain in the present mode). It should be pointed out that it is neither necessary nor possible for the decoder to maintain these two buffers. That is to say, there is no need for a change in the decoder or the receiving modem which enables the present invention to be integrated into a deployment of modems operating under a minimal-compatible implementation of V.42bis.

FIG. 2 depicts the procedure for testing the compression performance and for determining whether a transition of mode is in order, in accordance with a preferred embodiment of the present invention. In FIG. 2, a test compression process 200 first determines which of the operational modes is being carried out in the encoder by employing a query task 202. If query task 202 determines that the transparent mode is being employed then a task 203 determines a ratios of the respective utilized capacities of each of the two look-ahead buffers. It should be recalled from FIG. 1 that test compression process 200 is entered only upon the detection of one of either the codeword buffers or the transparent mode buffer reaching its capacity. Therefore, in a task 203, a ratio of the respective capacities is generated for comparison against a threshold value in a subsequent query task. The ratio defining a relative fullness ratio between the two look-ahead buffers is given by $$S = \frac{NB_C}{NB_T} \quad (5)$$

where $NB_C$ and $NB_T$ are the number of bits in the two respective buffers. For example, if the buffer $B_T$ is full, then $NB_T$ would be the length of $B_T$ in bytes times the number 8. Clearly, S is a measure of the benefit of transitioning between modes of operation. If the encoder of the present invention switches to compressed mode, then an estimate of the number of bits that are required to be transmitted is given by $$\ldots + C_{CT} + S8n + p_{ct}C_{CT} + \ldots \quad (6)$$

where n is an estimate of the number of characters that would be transmitted before the next test of the compression performance (i e., n is an estimate of the number of characters that would be transmitted in compressed mode before the mode could be switched back to transparent, and $P_{ct}$ is the probability that at the next compression performance test, the mode will be switched back to transparent. If the transparent mode of operation remains, then the encoder would transmit n characters and the number of bits transmitted would be $$\ldots + 8n + \ldots \quad (7)$$

Therefore, the encoder should switch the mode of operation from transparent to compressed if $$C_{TC} + S8n + P_{ct}C_{CT} \leq 8n. \quad (8)$$

Furthermore, in a task 205, a threshold value TH describing a preferred mode transition threshold is calculated and in a query task 207 a comparison of the buffer ratios with the threshold value is performed to determine whether a transition of mode is in order. Therefore, the threshold for switching is $$S \leq 1 - \frac{C_{TC} + P_{ct}C_{CT}}{8n} \quad (9)$$

When such a determination is in favor of transitioning from transparent to compression mode, a task 209 initiates the transition to compression mode. Likewise, when determination that the threshold value for transitioning modes has not been exceeded, a query task 211 is initiated for determining whether the present dictionary composition is desirable for continued utilization. The dictionary evaluation process is described in detail below.

Returning to the results of query task 202, when the current mode is determined to be the compressed mode, a buffer ratio similar to that of task 203 is computed in a task 204. Were the encoder to transition modes, an estimate of the number of bits that would be transmitted is given by $$\ldots + C_{CT} + 8n + P_{tc}C_{TC} + \ldots \quad (10)$$

while if the encoder were to remain in compressed mode, an estimate of the number of bits transmitted would be $$+ \ldots + S8n + \ldots \quad (11)$$

In order to perform an evaluation on the efficacy of transitioning modes, a threshold value is calculated in a task 206 that is used for comparison against the buffer ratios generated in task 204. The threshold value for transitioning from compressed mode to transparent mode is $$S \geq 1 + \frac{C_{CT} + P_{tc}C_{TC}}{8n} \quad (12)$$

If the comparison of the buffer ratios with the threshold value in a query task 208 determines that a transition is not in order, then processing returns and the encoder remains in the compressed state. However, if it is determined in query task 208 that a mode transition is preferred, a query task 210 similarly evaluates the efficiency of the present dictionary. Upon a determination in query task 210 that the dictionary remains sufficiently acceptable, then a task 212 performs the transition from compressed mode to transparent mode.

The present invention also provides a method for determining when a dictionary as it is presently populated with strings corresponding to codewords has outlived its effectiveness and should be reset or discarded. One such measure of the usefulness of a particular dictionary is to measure its usefulness factor as $$T = \frac{\text{number of used dictionary entries}}{\text{total dictionary size}} \quad (13)$$

If the dictionary is equal to or smaller than a usefulness threshold, for example, 1024 entries, it is not discarded since it can continue to grow and adapt to the input data. After a dictionary becomes, for example, 2000 or more and the compression ratio deteriorates, the encoder checks whether the dictionary is sufficiently useful. It should be noted that the encoder checks or references the dictionary whether it is useful or not only when the compression ratio is sufficiently low. That is to say, that if the compression ratio is of a satisfactory level then the evaluation of the dictionary may be foregone or accepted as being adequate without significant evaluation. However, if the number of used dictionary entries is low, implying that the dictionary is not being effective in providing a codeword for compression, then it would be advantageous to attempt to create a new dictionary which may be more consistent with the present data types being transmitted at the present time. When it is desirable to establish a new dictionary, the previous dictionary must be discarded which additionally provides the collateral benefit of reducing the codeword size which may accommodate further compression. Yet an additional benefit of discarding a dictionary and establishing a new dictionary which may be more representative of the present data type is that the search time required to discover a match of the present string may be reduced.

A data compression procedure has been described that is fully compatible with the V.42bis standard and may be incorporated into such standard and modems or other communication devices implementing such a standard without requiring or otherwise necessitating changes to any other compatible devices employing the standard. Therefore, the present invention provides the benefit of being both compatible with existing or legacy equipments implementing the standard as well as providing the improved benefit of evaluating the data received at the encoder and determining which mode of operation is more beneficial and efficient for the transfer of data over a network. Thus, the compression scheme that has been presented in the present invention is an enhancement and therefore an improvement to an existing standard that is widely accepted and very valuable in the communication marketplace. The present invention provides yet a further benefit of being able to adapt to a multimedia-type data stream which is very common in modern data exchange. That is to say, when a particular dictionary is established for servicing a particular data type, and such a data type transitions to yet a different media data type having differing data characteristics, the present invention may determine that such a data type which may be in an already compressed state is better transferred over the communication network using transparent mode.

Additionally, the present invention provides a mechanism for dealing with the transition of data types, for example, in a multimedia application, which facilitates the purging of a dictionary established for the transmission of one data type exhibiting a particular form of data characteristic by purging the dictionary and establishing new and therefore more efficient codewords corresponding to dictionary entries.

The present invention may be embodied in other specific forms without departing from its spirit or its essential characteristics. Thus, the desired embodiments are to be considered in all respects as illustrative only and not restrictive. The particular scope of the invention is indicated by the appended claims rather than by the foregoing description. All changes that come within the meaning and range of equivalency of the claims are to be embraced within their scope.

What is claimed is:

1. In a data communication device employing a data compression scheme capable of transmitting data in one of a compressed mode and a transparent mode, a method for determining a preferred mode of said compressed mode and said transparent mode for transmitting said data, said method comprising the steps of:
   a. buffering a present portion of said data for transmitting in a transparent look-ahead buffer in said communication device;
   b. encoding said present portion of said data for transmitting into corresponding codewords from a present compression dictionary;
   c. buffering said codeword in a compression look-ahead buffer;
   d. upon the filling of one of said look-ahead buffers, firstly comparing the relative fullness of each of said look-ahead buffers to determine a fullness ratio;
   e. secondly comparing said fullness ratio against a preferred mode transition threshold; and
   f. when said preferred mode transition threshold dictates a mode transition, transitioning from a present mode of one of said compressed mode and said transparent mode to said preferred mode of one of said compressed mode and said transparent mode for transmitting said present portion of said data.

2. In a data communication device, the method for determining a preferred mode, as recited in claim 1, wherein said secondly comparing said fullness ratio against a preferred mode transition threshold step further comprises the step of:
   a. calculating said preferred mode transition threshold to include a throughput overhead cost associated with transitioning between said present mode and said preferred mode.

3. In a data communication device, the method for determining a preferred mode, as recited in claim 2, wherein said calculating said preferred mode transition threshold to include a throughput overhead cost associated with transitioning between said present mode and said preferred mode step further comprises the step of:
   a. calculating said preferred mode transition threshold to include a probability of returning to said present mode on an evaluation of a subsequent portion of said data after a transition to said preferred mode on an evaluation of said present portion of said data.

4. In a data communication device, the method for determining a preferred mode, as recited in claim 3, wherein said calculating said preferred mode transition threshold step comprises the steps of:
   a. when a present mode of said one of said transparent mode and said compression mode is said transparent mode, calculating said preferred mode transition threshold as $$TH = 1 - \frac{C_{CT} + P_{CT}C_{CT}}{8n};$$

and
   b. when a present mode of said one of said transparent mode and said compression mode is said compression mode, calculating said preferred mode transition threshold as $$TH = 1 + \frac{C_{CT} + P_{TC}C_{TC}}{8n}.$$

5. In a data communication device, the method for determining a preferred mode, as recited in claim 1, wherein following said transitioning from said present mode to said preferred mode step, said method further comprising the step of:
   a. selecting said look-ahead buffer corresponding with preferred mode for transmitting one of said present portion of said data and said corresponding codewords.

6. In a data communication device, the method for determining a preferred mode, as recited in claim 1, wherein method further comprises the steps of:
   a. calculating a usefulness factor describing the effectiveness of said present dictionary; and
   b. when said usefulness factor exceeds a usefulness threshold, discarding said present dictionary develop a new present dictionary for storing a new set of codewords for use in said compression mode.

7. In a data communication device, the method for determining a preferred mode, as recited in claim 1, wherein said data compression scheme is compatible with the V.42bis data compression standard.

8. In a data communication device, a method for transmitting data in one of a compressed mode and a transparent mode, said method comprising the steps of:
   a. determining a preferred mode of said compressed mode and said transparent mode for transmitting said data, said determining step comprising the steps of:
      i. buffering a present portion of said data for transmitting in a transparent look-ahead buffer in said communication device;
      ii. encoding said present portion of said data for transmitting into corresponding codewords from a present compression dictionary;
      iii. buffering said codeword in a compression look-ahead buffer;
      iv. upon the filling of one of said look-ahead buffers, firstly comparing the relative fullness of each of said look-ahead buffers to determine a fullness ratio;
      v. secondly comparing said fullness ratio against a preferred mode transition threshold;
      vi. when said preferred mode transition threshold dictates a mode transition, transitioning from a present mode of one of said compressed mode and said transparent mode to said preferred mode of one of said compressed mode and said transparent mode for transmitting said present portion of said data;
   b. selecting said look-ahead buffer corresponding with preferred mode; and
   c. transmitting one of said present portion of said data and said corresponding codewords.

9. In a data communication device, the method for transmitting data, as recited in claim 8, wherein said secondly comparing said fullness ratio against a preferred mode transition threshold step further comprises the step of:
   a. calculating said preferred mode transition threshold to include a throughput overhead cost associated with transitioning between said present mode and said preferred mode.

10. In a data communication device, the method for transmitting data, as recited in claim 9, wherein said calculating said preferred mode transition threshold to include a throughput overhead cost associated with transitioning between said present mode and said preferred mode step further comprises the step of:
   a. calculating said preferred mode transition threshold to include a probability of returning to said present mode on an evaluation of a subsequent portion of said data after a transition to said preferred mode on an evaluation of said present portion of said data.

11. In a data communication device, the method for transmitting data, as recited in claim 10, wherein said calculating said preferred mode transition threshold step comprises the steps of:
   a. when a present mode of said one of said transparent mode and said compression mode is said transparent mode, calculating said preferred mode transition threshold as $$TH + 1 - \frac{C_{CT} + P_{CT}C_{CT}}{8n};$$

and
   b. when a present mode of said one of said transparent mode and said compression mode is said compression mode, calculating said preferred mode transition threshold as $$TH = 1 + \frac{C_{CT} + P_{CT}C_{TC}}{8n}.$$

12. In a data communication device, the method for transmitting data, as recited in claim 8, wherein following said transitioning from said present mode to said preferred mode step, said method further comprising the step of:
   a. selecting said look-ahead buffer corresponding with preferred mode for transmitting one of said present portion of said data and said corresponding codewords.

13. In a data communication device, the method for transmitting data, as recited in claim 8, wherein method further comprises the steps of:
   a. calculating a usefulness factor describing the effectiveness of said present dictionary; and
   b. when said usefulness factor exceeds a usefulness threshold, discarding said present dictionary develop a new present dictionary for storing a new set of codewords for use in said compression mode.

14. In a data communication device, the method for transmitting data, as recited in claim 8, wherein said data compression scheme is compatible with the V.42bis data compression standard.

15. In a data communication device employing a data compression scheme capable of transmitting data in one of a compressed mode and a transparent mode, a computer-readable medium having computer-executable instructions for determining a preferred mode of said compressed mode and said transparent mode for transmitting said data, said computer-executable instructions for performing the steps of:
   a. buffering a present portion of said data for transmitting in a transparent look-ahead buffer in said communication device;
   b. encoding said present portion of said data for transmitting into corresponding codewords from a present compression dictionary;
   c. buffering said codeword in a compression look-ahead buffer;
   d. upon the filling of one of said look-ahead buffers, firstly comparing the relative fullness of each of said look-ahead buffers to determine a fullness ratio;
   e. secondly comparing said fullness ratio against a preferred mode transition threshold; and
   f. when said preferred mode transition threshold dictates a mode transition, transitioning from a present mode of one of said compressed mode and said transparent mode to said preferred mode of one of said compressed mode and said transparent mode for transmitting said present portion of said data.

16. In a data communication device, the computer-readable medium having computer-executable instructions, as recited in claim 15, wherein said computer-executable instructions for performing the step of secondly comparing said fullness ratio against a preferred mode transition threshold step further comprises computer-executable instructions for performing the step of:

a. calculating said preferred mode transition threshold to include a throughput overhead cost associated with transitioning between said present mode and said preferred mode.

17. In a data communication device, the computer-readable medium having computer-executable instructions for determining a preferred mode, as recited in claim 16, wherein said computer-executable instructions for performing the step of calculating said preferred mode transition threshold to include a throughput overhead cost associated with transitioning between said present mode and said preferred mode step further comprises computer-executable instructions for performing the step of:

a. calculating said preferred mode transition threshold to include a probability of returning to said present mode on an evaluation of a subsequent portion of said data after a transition to said preferred mode on an evaluation of said present portion of said data.

18. In a data communication device, the computer-readable medium having computer-executable instructions for determining a preferred mode, as recited in claim 17, wherein said computer-executable instructions for performing the step of calculating said preferred mode transition threshold step comprises computer-executable instructions for performing the steps of:

a. when a present mode of said one of said transparent mode and said compression mode is said transparent mode, calculating said preferred mode transition threshold as $$TH = 1 - \frac{C_{CT} P_{CT} C_{CT}}{8n};$$

and b. when a present mode of said one of said transparent mode and said compression mode is said compression mode, calculating said preferred mode transition threshold as $$TH = 1 + \frac{C_{CT} P_{CT} C_{TC}}{8n}.$$

19. In a data communication device, the computer-readable medium having computer-executable instructions for determining a preferred mode, as recited in claim 15, wherein following said computer-executable instructions for performing the step of transitioning from said present mode to said preferred mode, said computer-executable instructions further comprising computer-executable instructions for performing the step of:

a. selecting said look-ahead buffer corresponding with preferred mode for transmitting one of said present portion of said data and said corresponding codewords.

20. In a data communication device, the computer-readable medium having computer-executable instructions for determining a preferred mode, as recited in claim 15, wherein said computer-executable instructions further comprise computer-executable instructions for performing the steps of:

a. calculating a usefulness factor describing the effectiveness of said present dictionary; and b. when said usefulness factor exceeds a usefulness threshold, discarding said present dictionary develop a new present dictionary for storing a new set of codewords for use in said compression mode.

21. In a data communication device, the computer-readable medium having computer-executable instructions for determining a preferred mode, as recited in claim 15, wherein said computer-executable instructions are compatible with the data compression scheme of the V.42bis data compression standard.

* * * * *